United States Patent [19]
Kazerounian

[11] Patent Number: 5,949,711
[45] Date of Patent: Sep. 7, 1999

[54] DUAL BIT MEMORY CELL

[75] Inventor: Reza Kazerounian, Danville, Calif.

[73] Assignee: Waferscale Integration, Inc., Fremont, Calif.

[21] Appl. No.: 08/936,849

[22] Filed: Sep. 24, 1997

Related U.S. Application Data

[60] Provisional application No. 60/026,718, Sep. 26, 1996.

[51] Int. Cl.$^6$ .................................................. G11C 16/04
[52] U.S. Cl. .............................. 365/185.05; 365/185.01; 365/185.03
[58] Field of Search ........................ 365/185.01, 185.05, 365/185.03, 185.26

[56] References Cited

U.S. PATENT DOCUMENTS

| | | | |
|---|---|---|---|
| 5,021,999 | 6/1991 | Kohda et al. | 365/168 |
| 5,151,375 | 9/1992 | Kazerounian et al. | 437/43 |
| 5,214,303 | 5/1993 | Aoki | 257/390 |
| 5,267,194 | 11/1993 | Jang | 365/185 |
| 5,278,439 | 1/1994 | Ma et al. | 257/319 |
| 5,394,355 | 2/1995 | Uramoto et al. | 365/104 |
| 5,414,693 | 5/1995 | Ma et al. | 365/185 |
| 5,434,825 | 7/1995 | Harari | 365/185 |
| 5,661,053 | 8/1997 | Yuan | 437/43 |
| 5,714,412 | 2/1998 | Liang et al. | 438/266 |
| 5,760,435 | 6/1998 | Pan | 257/314 |

OTHER PUBLICATIONS

Yoshimitsu Yamauchi et al., "A 5V–Only Virtual Ground Flash Cell with An Auxiliary Gate for High Density and High Speed Application", 1991 IEEE, VLSI Research Laboratory, Sharp Corporation, pp. 319–322 IEDM 91.

A. T. Wu et al., "Novel High–Speed, 5–Volt Programming EPROM Structure With Source–Side Injection", 1986 IEEE, Department of Electrical Engineering and Computer Sciences, pp. 584–586 IEDM 86.

*Primary Examiner*—David Nelms
*Assistant Examiner*—Tuan T. Nguyen
*Attorney, Agent, or Firm*—Skjerven, Morrill MacPherson, Franklin & Friel, LLP

[57] ABSTRACT

A dual bit memory cell includes a substrate, a gate unit and left and right diffusions implanted into the substrate on the outer sides of the gate unit such that a channel exists under the gate unit and between the left and right diffusions. The gate unit includes a control gate and left and right separately programmable floating gates located on the left and right sides of the control gate. Each floating gate controls a short portion of the channel. The left diffusion acts as a drain and the right diffusion acts as a source when reading the value stored in the right floating gate and the right diffusion acts as a drain and the left diffusion as a source when reading the value stored in the left floating gate. In one embodiment, the floating gates are formed of polysilicon spacers.

7 Claims, 14 Drawing Sheets

FIG.8A
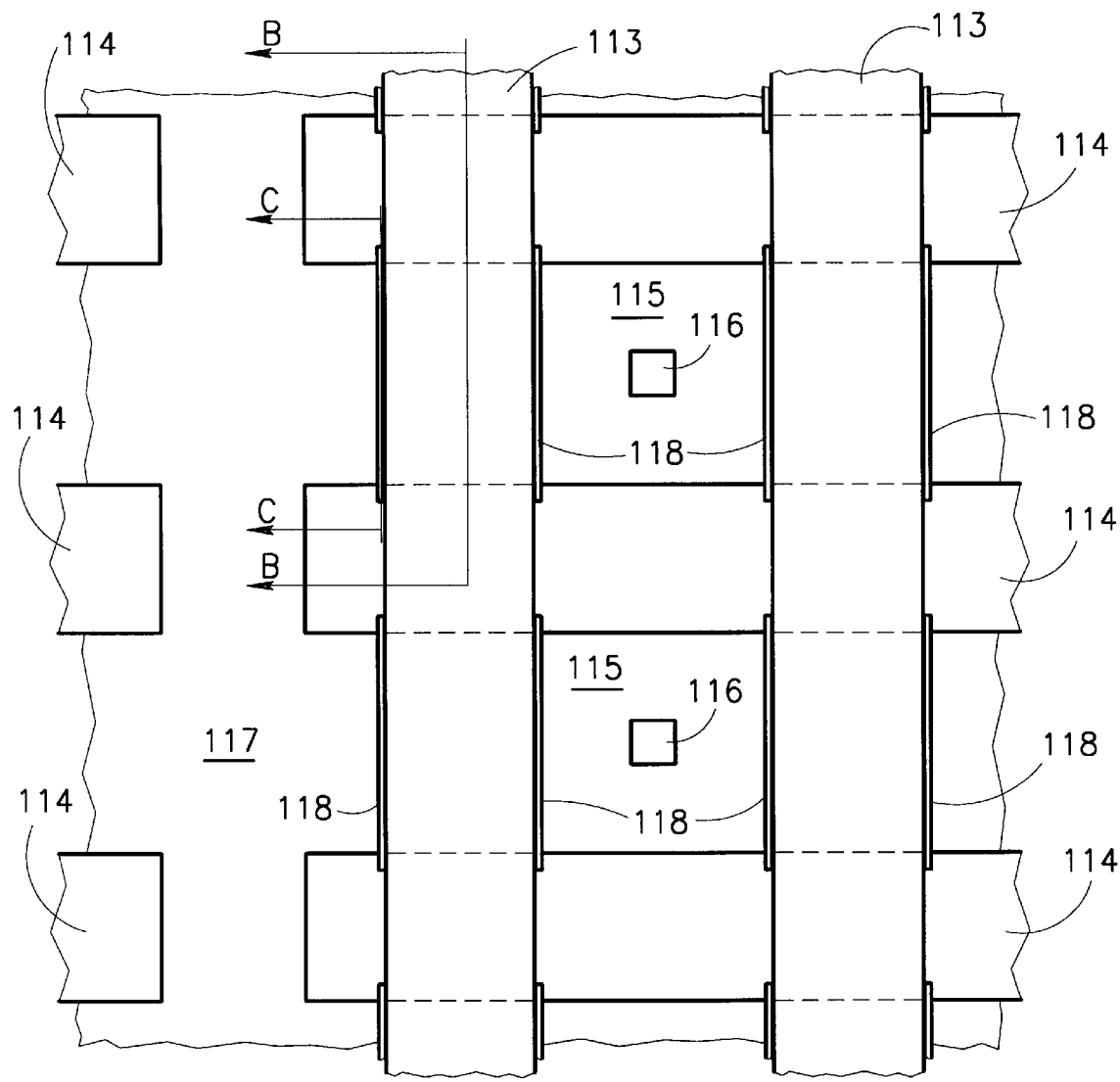
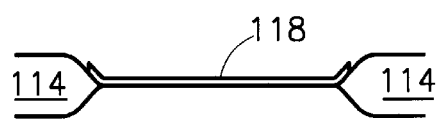
FIG.8B
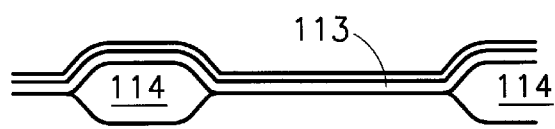
FIG.8C

DUAL BIT MEMORY CELL

CROSS-REFERENCE TO RELATED APPLICATION

This application is based on, and claims priority from, U.S. Provisional Application No. 60/026,718, filed Sep. 26, 1996.

FIELD OF THE INVENTION

The present invention relates to floating gate memory cells in general and to dual bit cells in particular which double the storage capacity of a memory array.

BACKGROUND OF THE INVENTION

Floating gate cells are known in the art. FIGS. 1A and 1B, to which reference is now made, illustrate the standard circuit indication and the physical shape of an exemplary floating gate cell. FIG. 1C, to which reference is also made, illustrates the floating gate cell in an active state.

Each floating gate cell is built on a substrate 8 (FIG. 1B) in which are created a source 10 and a drain 12. A channel 13 exists between the source 10 and drain 12. On top of the substrate 8 are a control gate 14 and a floating gate 16, the latter of which can programmably store charge therein. If the floating gate stores charge, the cell is said to be programmed to a "0" state. Otherwise, if no charge is stored in the floating gate 16, the cell is in a "1" state. Each floating gate cell stores a single bit of data, which is either in the "0" or "1" state.

Extensive efforts have been made to shrink the cell size in floating gate cell memory arrays where the smaller the cell size, the smaller the integrated circuit die or chip containing a given number of floating gate cells and, therefore, the higher the yield of useful semiconductor dice in the manufacturing process. Moreover, because a smaller cell size results in a smaller integrated circuit die for a given size array, more semiconductor die can be obtained from a given sized wafer and thus, the manufacturing cost per die is lower. Accordingly, efforts have been made to reduce the size of the floating gate cell and/or to apply a more dense array architecture, such as with a virtual ground architecture. An example of a reduced size array architecture is the alternate metal, virtual ground (AMG) architecture, described in U.S. Pat. No. 5,151,375, assigned to the common assignees of the present invention.

The floating gate cell size is reduced by reducing the minimum "design rule" defining the minimum size (length and/or width) of certain elements, such as the control gate 14, the floating gate 16 and sometimes, of the drain 12 and source 10, of the floating gate cell. Design rules of 0.8 $\mu$m and smaller are known in the art. However, it is noted that the design rules cannot get infinitely smaller without affecting the functionality of the floating gate cell.

To read the information stored in the floating gate 16, a drain voltage is placed on the drain 12 and the source 10 is connected to ground. The gate is connected to a gate voltage $V_g$ and the cell is monitored for any current in the channel 13.

If the floating gate 16 is not charged (e.g. the "1" state), the threshold level $V_t$ of the cell is quite low. For example, it might be less than 2V. The effective gate voltage available to turn on the channel, which is the gate voltage $V_g$ less the threshold voltage $V_t$, effectively is, accordingly, sufficiently large and thus, induces depletion and inversion layers 20 and 22, respectively, (FIG. 1C) in the channel 13. The depletion layer 20 has positive ions in it and the inversion layer 22, which is at the surface of substrate 8 within the channel 13, has free electrons in it. Under the influence of the electric field generated by the voltage on the control gate 14, the free electrons move within the inversion layer 22 from the source 12 to the drain 10, thereby creating a measurable current within the channel 13.

If the floating gate 16 is charged, the threshold level $V_t$ of the cell is close to the gate voltage $V_g$. For example, it might be greater than 4.5V. Accordingly, the effective gate voltage ($V_g$–$V_t$) is relatively small and, therefore, no significant channel current is flowing. Accordingly, the cell is turned off.

In order to increase the data density of a memory array, without significantly increasing its size, integrated circuit designers have designed multi-bit floating gate cells. These cells are similar to the one shown in FIG. 1B but have a multiplicity of threshold voltages defined therefor. Each threshold voltage defines a different bit state. For example, a cell might have four threshold voltages defined where the lowest voltage might indicate a "00" state, the second lowest voltage might indicate a "01" state, the third lowest might indicate a "10" state and the fourth voltage might indicate a "11" state.

These multi-threshold floating gate cells utilize the same real estate in the memory portion of the memory array; however, they require more complicated sensing apparatus (to differentiate among the four voltage states) which occupies a larger portion of the array.

The following prior art references are related to multibit semiconductor memory cells: U.S. Pat. No. 5,021,999 to Kohda et al., U.S. Pat. No. 5,214,303 to Aoki, U.S. Pat. No. 5,394,355 to Uramoto et al., U.S. Pat. No. 5,414,693 to Ma et al. and U.S. Pat. No. 5,434,825 to Harari.

SUMMARY OF THE PRESENT INVENTION

It is an object of the present invention to provide a dual bit floating gate cell which stores two bits of data in separate floating gates formed at the side of a control gate. Each floating gate is separately programmed and separately read and, since the floating gates are quite small, do not significantly add to the space occupied by the floating gate cell. Thus, the present invention doubles the storage capacity of a floating gate memory array without significantly increasing its size.

There is therefore provided, in accordance with a preferred embodiment of the present invention, a dual bit memory cell including a substrate, a gate unit and left and right diffusions implanted into the substrate on the outer sides of the gate unit such that a channel exists under the gate unit and between the left and right diffusions. The gate unit includes a control gate located above the substrate and left and right separately programmable floating gates located on the left and right sides of the control gate. Each floating gate controls a short portion of the channel. The left diffusion acts as a drain and the right diffusion acts as a source when reading the value stored in the right floating gate and the right diffusion acts as a drain and the left diffusion as a source when reading the value stored in the left floating gate.

Additionally, in accordance with a preferred embodiment of the present invention, the floating gates are formed of "polysilicon spacers" which are elements formed from a layer of polysilicon draped over the control gate and etched back. The resultant floating gate approximately has the size and shape of a prior art "spacers" or "sidewalls".

Moreover, in accordance with a preferred embodiment of the present invention, the left diffusion acts as a drain and the right diffusion acts as a source when programming the value stored in the left floating gate and the right diffusion acts as a drain and the left diffusion as a source when programming the value stored in the right floating gate.

The present invention also incorporates process steps for manufacturing an array of dual bit memory cells for virtual ground and standard EPROM architectures.

BRIEF DESCRIPTION OF THE DRAWINGS

The present invention will be understood and appreciated more fully from the following detailed description taken in conjunction with the drawings in which:

FIG. 8A is a layout illustration of the present invention incorporated into a standard EPROM architecture;

FIGS. 8B and 8C are cross-sectional illustrations of portions of the array of FIG. 8A as marked by lines B—B and C—C.

DETAILED DESCRIPTION OF PREFERRED EMBODIMENTS

A Discussion of Cells with Short Channels

Figure 1A:
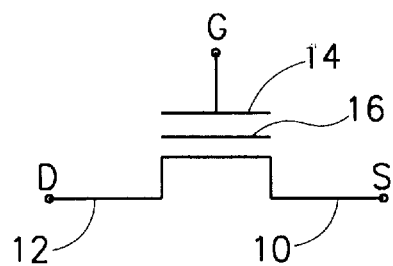
FIG. 1A is a circuit illustration of a single bit, prior art floating gate cell.
Figure 1B:
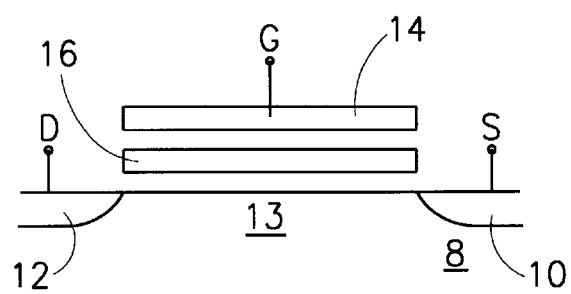
FIG. 1B is a structural illustration of the floating gate cell of FIG. 1A.
Figure 1C:
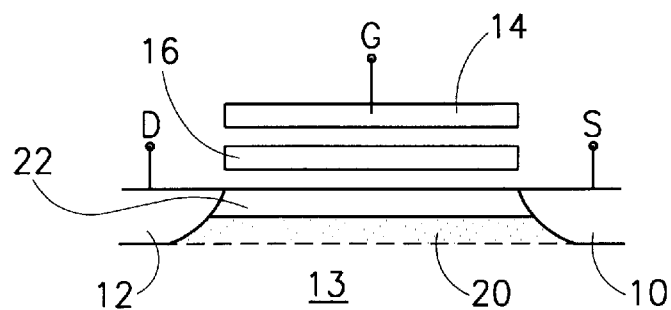
FIG. 1C is an illustration of the floating gate cell of FIG. 1B in an activated state.
Figure 2A:
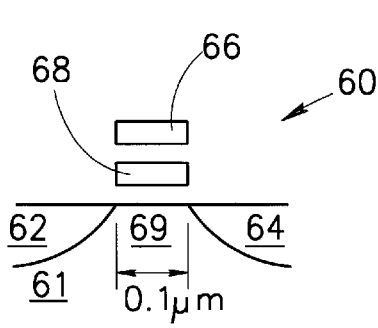
FIG. 2A is a structural illustration of a short channel, single bit, floating gate cell of the prior art.

Before discussing the present invention, it is useful to review the effects of short channels on the operation of floating gate cells. Accordingly, reference is now briefly made to FIGS. 2A, 2B and 3 which respectively illustrate a prior art single bit, floating gate cell 60 which has a short channel (FIGS. 2A and 2B) and the effect of the short channel on the effective threshold level (FIG. 3).

Single bit cell 60 has a substrate 61, two diffusions, known as the source 62 and the drain 64 and a control gate 66. In addition, it has a single floating gate 68 located between the substrate 61 and the control gate 66. Between diffusions 62 and 64 is a short channel 69, typically of length 0.1 µm or less.

Figure 2B:
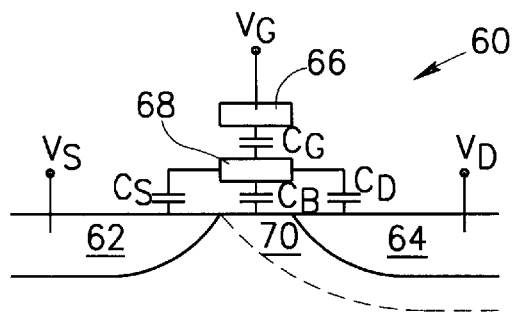
FIG. 2B is an illustration of the floating gate cell of FIG. 3A in an activated state.
Figure 3:
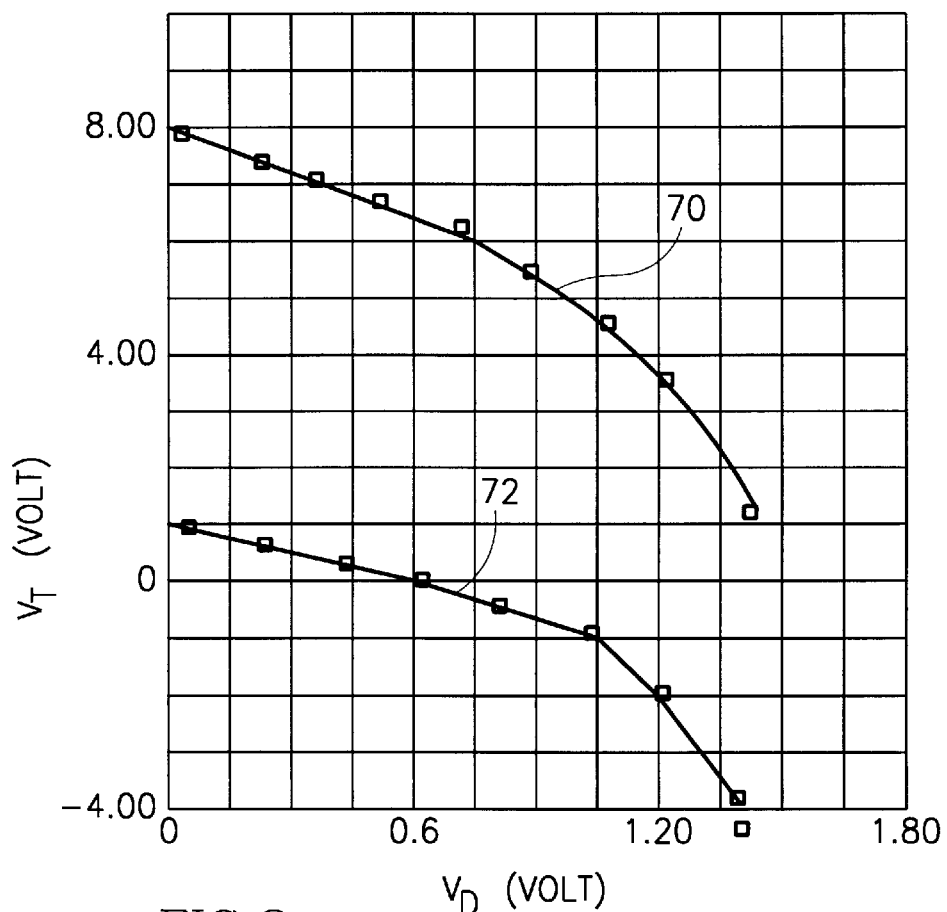
FIG. 3 is a graphical illustration of the effective threshold voltage of the floating gate cell of FIG. 2A as a function of the drain voltage.

As indicated in FIG. 2B, there are three voltage terminals, one on the control gate 66 providing the gate voltage $V_g$, one on the source 62 providing the source voltage $V_s$ and one on the drain 64 providing the drain voltage $V_d$. For example, the gate voltage $V_g$ might be 5V, the source voltage $V_s$ might be 0V and the drain voltage $V_d$ might be 2V. When the voltages are applied to the cell 60, the drain voltage $V_d$ is large enough to induce a depletion region 70 near drain 64. Since the channel 69 is short, the depletion region 70 extends almost or entirely to the source 62. This is known as "barrier lowering" and it causes "punch-through" of electrons from the source 62 to the drain 64. The punch-through current only minimally controlled by the amount of charge in the floating gate 68.

It will be appreciated that the combination of a large depletion area and a punch-through current is present because the channel 69 is too short to operate properly.

Furthermore, as indicated in FIG. 2B, the applied voltages are coupled to the floating gate through coupling capacitances $C_g$ (between the two gates 66 and 68), $C_d$ (between the floating gate 68 and the drain 64), $C_s$ (between the floating gate 68 and the source 62) and $C_b$ (between the floating gate 68 and the substrate 61).

The voltage of the floating gate $V_{fg}$ is defined as:

$$V_{fg} \approx V_d \frac{C_d}{C_{tot}} + V_G \frac{C_g}{C_{tot}} + V_{channel} \frac{C_b}{C_{tot}} + V_s \frac{C_s}{C_{tot}} + \frac{Q_{fg}}{C_g} \qquad \text{Equation 1}$$

where $C_{tot}$ is the sum of the individual capacitances and $Q_{fg}$ is the amount of charge stored in the floating gate. It is noted that, since the source voltage $V_s$ is small or close to 0, the voltage coupled through $C_s$ is negligible. However, the voltage coupled through the remaining capacitances, $C_g$, $C_d$ and $C_B$, affect the voltage level $V_{fg}$ of the floating gate, irrespective of the amount of stored charge $Q_{fg}$. A change in the drain voltage $V_d$ will affect the voltage level $V_{fg}$ of the floating gate by $V_d C_d / C_{tot}$. This effect is known as "drain coupling" and it increases with a reduction of the channel length.

Both drain coupling and the short channel effect are functions of the drain voltage level $V_d$ and both reduce the effective threshold voltage $V_t$ of the cell 60. This is shown in FIG. 3 which illustrates the effective threshold voltage $V_t$ as a function of the drain voltage $V_d$ for a short channel cell such as cell 60. Graph 70 indicates the threshold voltage for a programmed cell and graph 72 indicates the threshold voltage for an unprogrammed cell.

FIG. 3 indicates that the effective threshold voltage of a short channel cell, whether programmed or not, drops significantly as the drain voltage $V_d$ increases from 0V to 1.6V. For a drain voltage $V_d$ of 0.2V, the programmed cell has an effective threshold level $V_{tp}$ of about 7.5V while for a drain voltage $V_d$ of 1.4V, the programmed cell has an effective threshold level $V_{tp}$ of about 1.1V. Similarly, the unprogrammed cell has an effective threshold level $V_{tu}$ of about 1.0V at $V_d$ of 0.2V which drops to 4.0V at a drain voltage $V_d$ of 1.4V.

At standard drain voltages, which are typically above 1.4V, a short channel cell always looks unprogrammed. For this reason, prior art integrated circuit designers laid out their circuits to ensure that no cells had short channels.

The Dual Bit Cell of the Present Invention

Figure 4A:
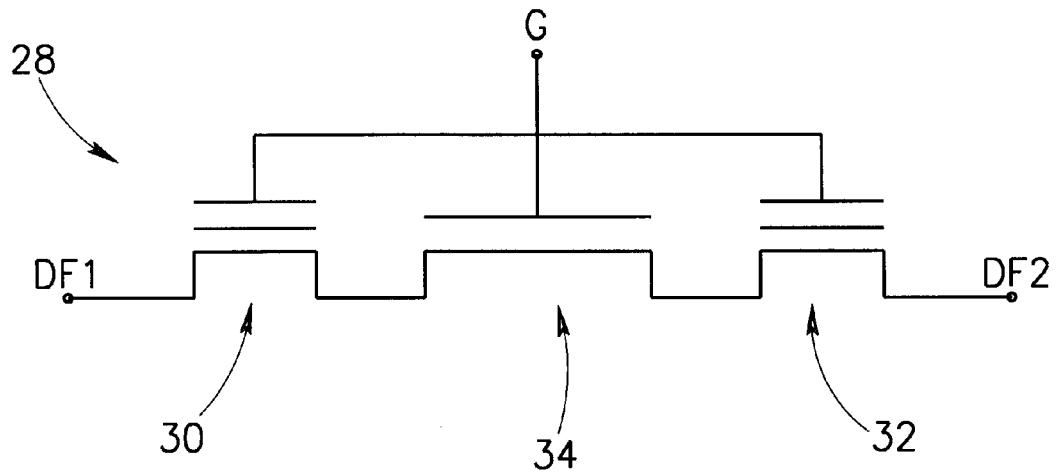
FIG. 4A is a circuit illustration of a dual bit floating gate cell, constructed and operative in accordance with a preferred embodiment of the present invention.
Figure 4B:
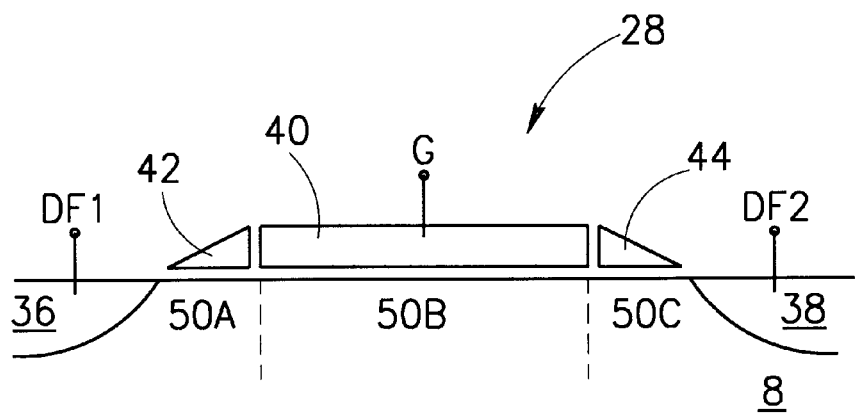
FIG. 4B is a structural illustration of the floating gate cell of FIG. 4A.
Figure 5:
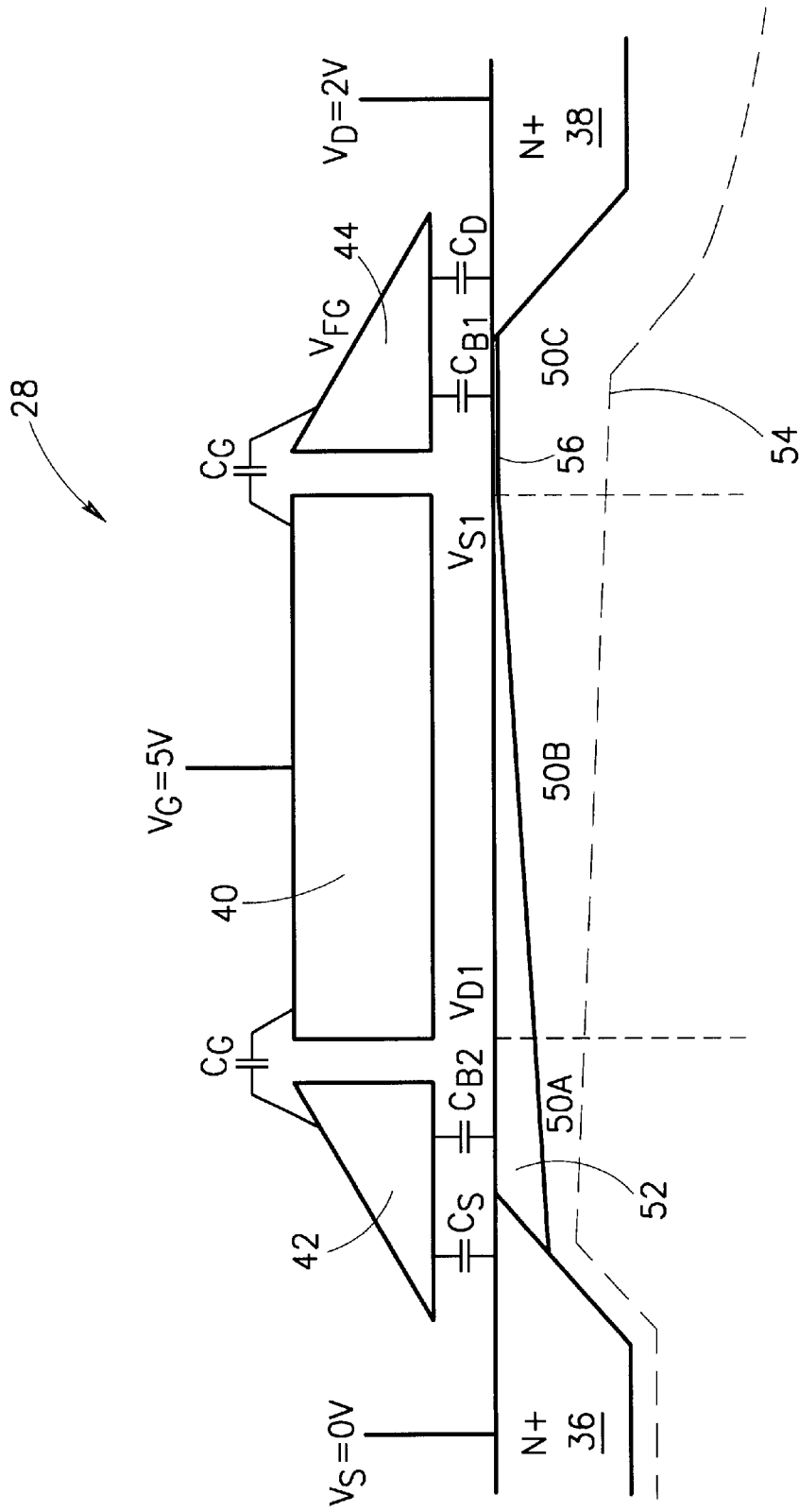
FIG. 5 is an illustration of the dual bit floating gate cell of FIG. 4A in an activated state.

Reference is now made to FIGS. 4A and 4B which illustrate a dual bit floating gate cell, constructed and operative in accordance with a preferred embodiment of the present invention, which has two separate, short floating gates and utilizes the short channel effect and drain coupling to separately read and program the two floating gates. Reference is also made to FIG. 5.

The dual bit cell 28 of the present invention is schematically illustrated in FIG. 4A as two single bit floating gate cells 30 and 32 which sandwich an n-channel cell 34, all of whose control gates are connected together at the connection labeled G. The cell 28 is further controlled by two signals, DF1 and DF2, which are connected to the left side of cell 30 and the right side of cell 32.

Physically, the dual bit cell 28 has two diffusions 36 and 38, to which signals DF1 and DF2 are respectively connected, a control gate 40, to which the gate signal G is connected, and two floating gates 42 and 44, one at each side of the control gate 40. In one embodiment of the present invention, the floating gates 42 and 44 are formed of polysilicon spacers which are spacer-like elements formed from a layer of polysilicon draped over the control gate and etched back.

The diffusions 36 and 38 are found to the left and right, respectively, of floating gates 42 and 44, within the substrate 8. Between the diffusions 36 and 38 is a channel 50 beneath floating gate 42, control gate 40 and floating gate 44. Channel 50 can be envisioned to be formed of three consecutive subchannels, labeled 50a, 50b and 50c, respectively beneath floating gate 42, control gate 40 and floating gate 44.

As will be described in more detail hereinbelow, floating gates 42 and 44 are individually read and programmed and thus, the cell of the present invention stores two, individual bits of data.

It will be appreciated that dual bit cell 28 has a single control gate 40 whose length is the design rule of the array, such as 0.5 $\mu$m, and only two diffusions 36 and 38. Floating gates 42 and 44 add very little to the length of the cell 28 since they are quite small. In addition, they can be formed as spacers, a common element utilized in the prior art for widening the effective length of the channel. Thus, the present invention doubles the storage capacity of an EPROM memory array without significantly increasing the size of the EPROM memory array.

It is noted that floating gates 42 and 44 are quite small and, accordingly, their associated subchannels 50a and 50c are quite short compared to the channel 50b of control gate 40. Typically, subchannels 50a and 50c are below 0.2 $\mu$m in length and subchannel 50b is 0.3–0.5 $\mu$m long. Thus, the short channel effects, described hereinabove with respect to FIGS. 2A, 2B and 3, will occur in the small subchannels 50a and 50c. The present invention, however, utilizes the short channel effect and the drain coupling to enable two bits of data to be stored in the separate floating gates of a single cell.

FIG. 5 schematically illustrates the operation of the dual bit cell 28 for reading a bit value of "1" stored in the non-charged floating gate 42. A gate voltage $V_g$, for example of 5V, is placed on the control gate 40, a source voltage $V_s$, for example of 0V, is placed on diffusion 36 and a drain voltage $V_d$, for example of 2V, is placed on diffusion 38.

The presence of the gate and drain voltages $V_g$ and $V_d$, respectively, induce a depletion layer 54 and an inversion layer 52. Since the floating gate 44 is close to diffusion 38 which acts as the drain for this case and since floating gate 44 controls the short channel 50c, the short channel effect occurs in short subchannel 50c. Thus, depletion layer 54 extends the drain region across subchannel 50c and there is current flow along the surface (as indicated by a thin layer labeled 56) due to factors discussed hereinabove.

However, since floating gate 42 is near diffusion 36 which, for this case, acts as the source, the voltage level on diffusion 36 is small and thus, no short channel effect or any substantial voltage coupling to the floating gate from the source or channel in subchannel 50a. Instead, since floating gate 42 is not charged, inversion layer 52 is present and extends into subchannel 50b under control gate 40.

It will be appreciated that the channel 50 has a spread of voltage levels from the drain voltage $V_d$ to the source voltage $V_s$. The voltage $V_{d1}$ at the boundary between subchannel 50a and subchannel 50b is, in effect, the drain voltage for the floating gate 42. Similarly, the voltage $V_{s1}$ at the boundary between subchannel 50b and subchannel 50c becomes, in effect, the source voltage for the floating gate 44. It will be appreciated that, because the subchannels 50a and 50c are short, voltage $V_{d1}$ is fairly close to source voltage $V_s$ and voltage $V_{s1}$ is fairly close to drain voltage $V_d$.

As indicated in FIG. 5, coupling capacitances are present throughout the dual bit cell 28. Because diffusion 36 is the source for this case, the voltage $V_{d1}$ is small. Accordingly, the terms of equation 1 which are multiplied by the drain and channel voltages are negligible and, for floating gate 42, equation 1 reduces to:

$$V_{fg42} \approx V_g \frac{C_g}{C_{tot}} + \frac{Q_{fg42}}{C_g} \qquad \text{Equation 2}$$

However, for floating gate 44, equation 1 is not reduced. Thus, the voltage coupled to floating gate 44 is large while it is small for floating gate 42.

The combination of drain coupling and short channel effects for floating gate 44 ensure that the current under floating gate 44 is not significantly affected by the amount of charge stored therein. Thus, the current measured at the source diffusion 36 responds to the programmed state of floating gate 42.

The above fact is emphasized when considering FIG. 3 once again. Assume that the two drain voltages are: $V_d$ is 2V for floating gate 44 and $V_{d1}$ is approximately 0.2V for floating gate 42. For floating gate 44, the drain voltage $V_d$ is so high (2V) that, as discussed hereinabove, the floating gate 44 always appears to be unprogrammed. However, for floating gate 42, the drain voltage $V_{d1}$ is small enough that the effective threshold voltages for the programmed and unprogrammed states are close to their expected values (above 4V for programmed and below 2V for unprogrammed) such that the two states can be distinguished.

FIG. 5 illustrates the dual bit cell 28 when there is no charge stored in floating gate 42. When there is charged stored therein, no inversion layer is present under floating gate 42. However, the short channel effect and the drain coupling of floating gate 44 will still occur, irrespective of the charge in floating gate 42. Thus, the value of the bit in floating gate 42 can be read.

In accordance with a preferred embodiment of the present invention, to read the bit in floating gate 44, the source and drain voltages are reversed. Thus, diffusion 36 becomes the drain and diffusion 38 becomes the source. The short channel effects and drain coupling, accordingly, occur in subchannel 50a and thus, floating gate 42 no longer controls the current in subchannel 50a. The value of the bit in floating gate 44 can thus be read irrespective of the value of the bit stored in floating gate 42.

The dual bit cells 28 is programmed in the opposite directions to those of reading. Thus, to program floating gate 44, a programming voltage, of typically 6–8V, is placed on diffusion 38 and a low voltage, such as of 0V, is placed on diffusion 36. A high voltage, of typically 12V, is placed on the control gate 40. The spread of voltages across the channel 50 ensures that the voltage on the drain $V_{d1}$ of floating gate 42 will be low enough that no programming occurs to floating gate 42. Instead, only floating gate 44 has a large enough field generated in its vicinity, due to the programming voltage placed on diffusion 38.

Similarly, to programming floating gate 42, the programming voltage is placed on diffusion 36 and the low voltage is placed on diffusion 38.

Table 1 lists the states the diffusions 36 and 38 should be in for reading and programming the dual bit cell 28, where cell 1 is defined as the cell whose charge is stored in floating gate 42 and cell 2 is defined as the cell whose charge is stored in floating gate 44.

TABLE 1

Source/Drain States for Dual Bit Cell 28

|  | Diffusion 36 | Diffusion 38 | Control Gate 40 |
| --- | --- | --- | --- |
| Read Cell 1 | Source | Drain | Gate |
| Read Cell 2 | Drain | Source | Gate |
| Program Cell 1 | Drain | Source | Gate |
| Program Cell 2 | Source | Drain | Gate |
| Erase EPROM - use UV light | — | — | — |
| Erase FLASH EPROM | High Voltage | High Voltage | Low Voltage |

For example, for reading, the source voltage might be 0V, the drain voltage might be 2V and the gate voltage might be 5V. For programming, the drain voltage might 6–8V, the source voltage might be 0V and the gate voltage might be 12V. For erase, the diffusion voltage might be 6V and the gate voltage might be –8V.

Reference is now made to FIGS. 6A, 6B, 6C and 6D which illustrate the key manufacturing process steps of an exemplary method for creating one embodiment of dual bit cell 28 in which the floating gates 42 and 44 are formed of polysilicon spacers. It will be appreciated that dual bit cell 28 can be created within any type of floating gate array and that the particular manufacturing process may have many difference steps; however, the steps of FIGS. 6A–6D must occur at some time during the manufacturing.

Figure 6A:
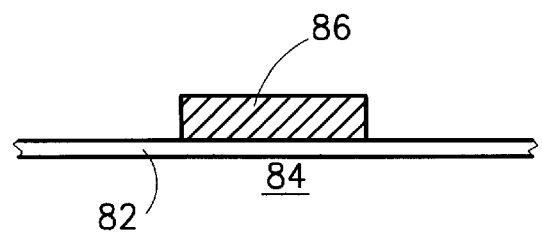
FIGS. 6A, 6B, 6C and 6D are illustrations of key process steps for forming the cell of FIG. 4A.

An oxide layer 82 is grown on a substrate 84. Using a mask having a minimum design rule, a polysilicon layer control gate 86 is formed on the oxide layer 82. The result is shown in FIG. 6A. The thickness of the control gate 86 is at least partially defined by the desired length of the spacer floating gates 42 and 44, wherein the thicker the control gate 86, the wider the spacer floating gates will be. For example, for 0.2 μm spacers, the control gate 86 should be between 0.15 μm and 0.35 μm.

Figure 6B:
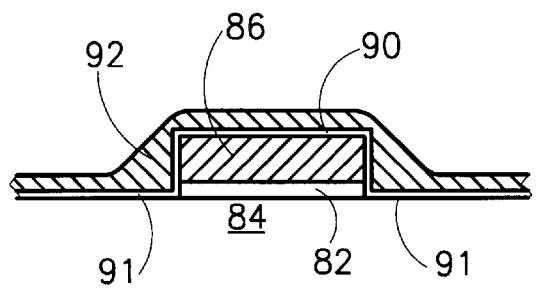
Figure 6C:
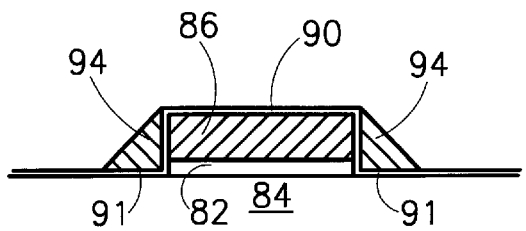

The portion of oxide layer 82 not underneath the control gate 86 is then removed, after which a further oxide layer 90 is grown over the control gate 86. The oxide layer 90 isolates the control gate 86 from the to be formed floating gates and can also be a dielectric layer or a deposited oxide layer. Typically, a channel oxide 91 is also grown, or laid down, at the same time, on the surface of the substrate 84 not covered by the control gate 86. Subsequently, a thin polysilicon layer 92, from which the spacer floating gates will be formed, is deposited over the oxide layer 90. The result is shown in FIG. 6B.

The polysilicon layer 92 is then anisotropically etched from the top of the oxide layer 90, to form the spacer floating gates, labeled 94 (FIG. 6C), on the sides of the control gate 86.

Figure 6D:
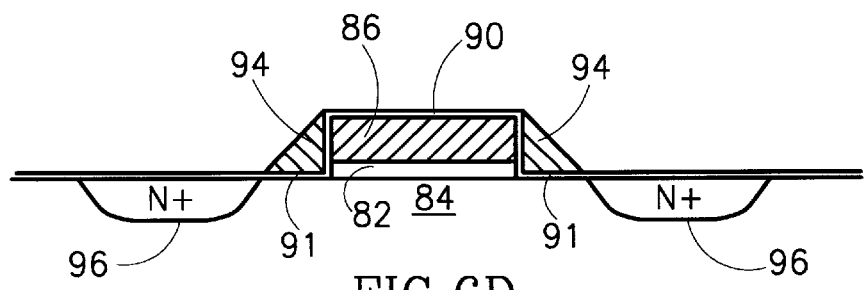

The final step, shown in FIG. 6D, is a self-aligned N+ implant (of arsenic or phosphorous) to create the diffusions, labeled 96, at the sides of floating gates 94.

It will be appreciated that the only operation which requires a mask, and thus, which is defined by the design rule, is the definition of the control gate 86. The deposition of the spacer floating gates 94 is a deposition over the entire array, as is the step of etching back the spacer deposition. The result are very short channel floating gate spacers on each side of the control gate 86.

Reference is now made to FIGS. 7A, 7B, 7C, 7D, 7E, 7F and 7G which illustrate process steps to create the cell of the present invention within a virtual ground architecture.

Figure 7A:
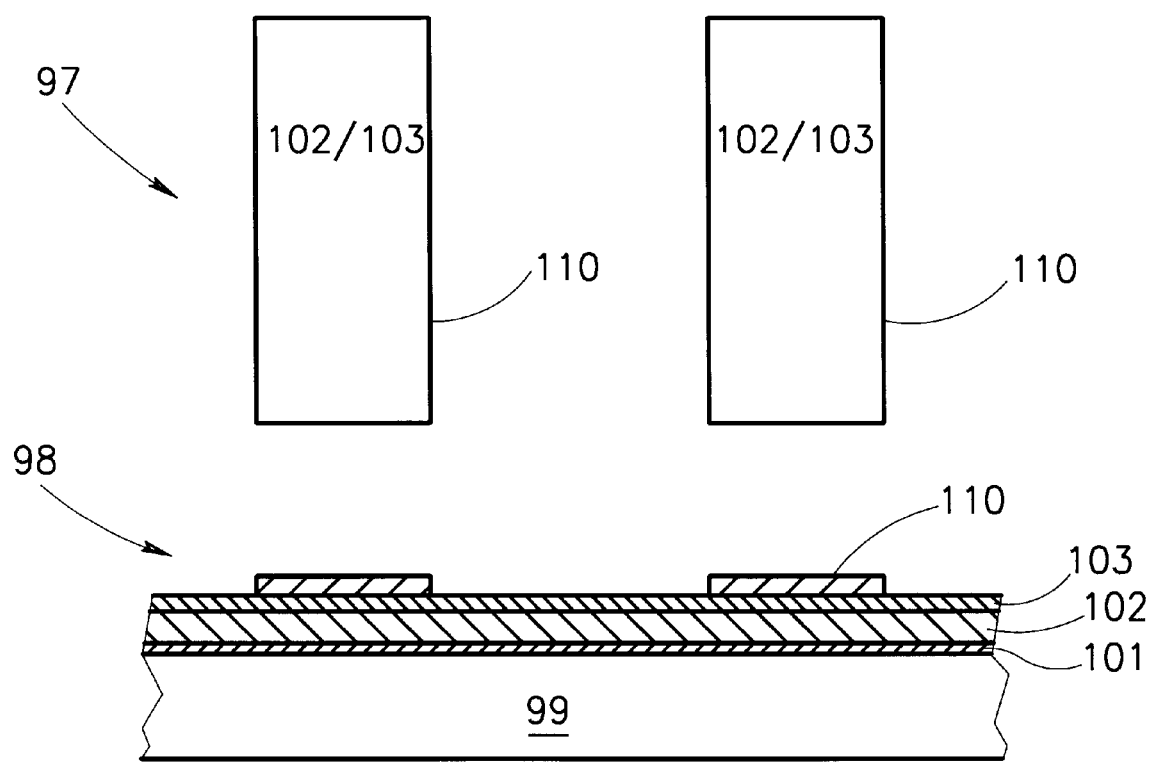
FIGS. 7A, 7B, 7C, 7D, 7E, 7F and 7G are illustrations of process steps to create the cell of the present invention within a virtual ground architecture.
Figure 7B:
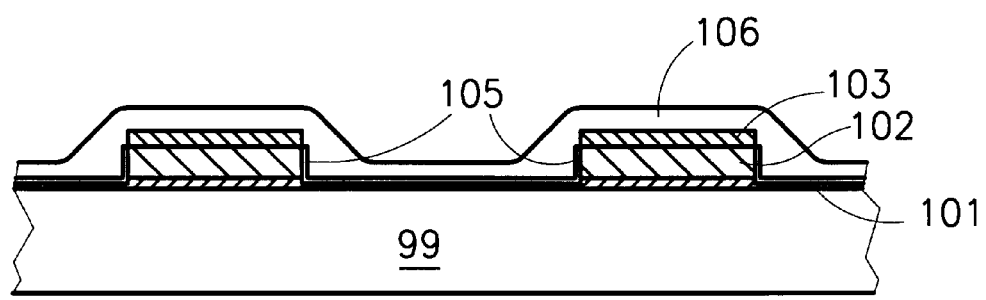
Figure 7C:
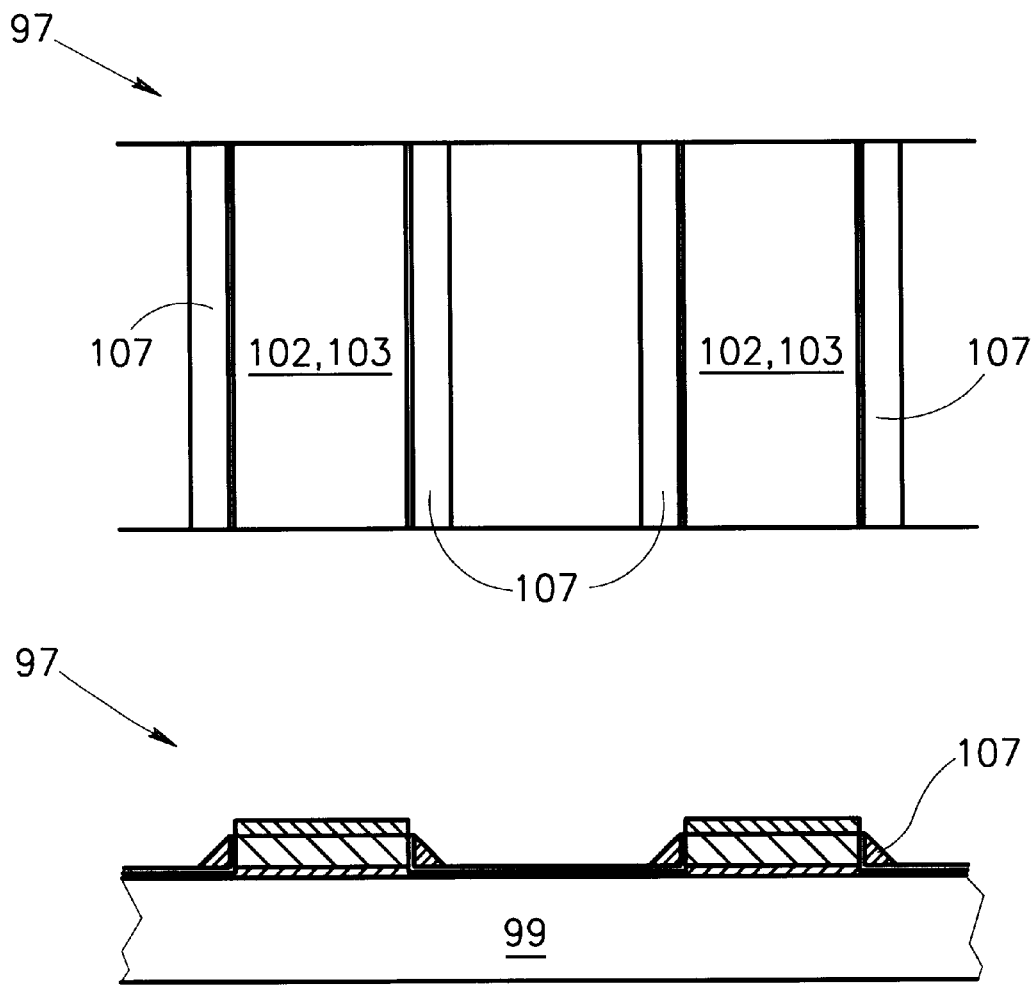
Figure 7D:
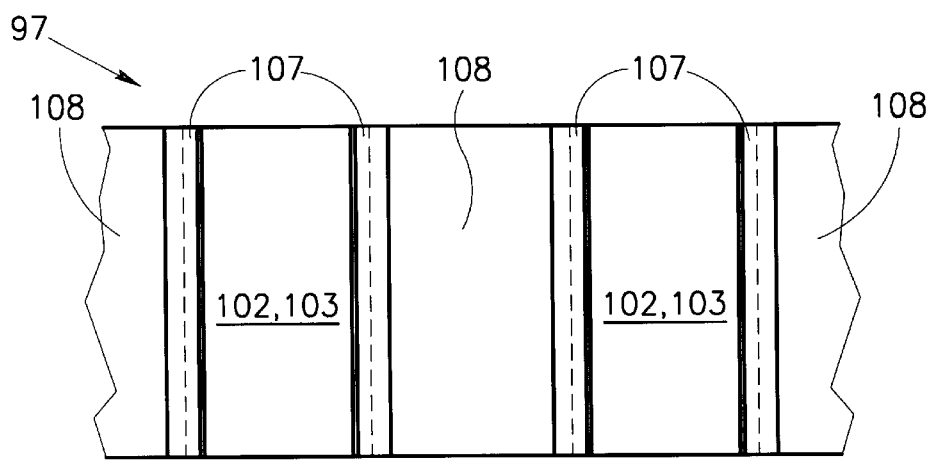
Figure 7E:
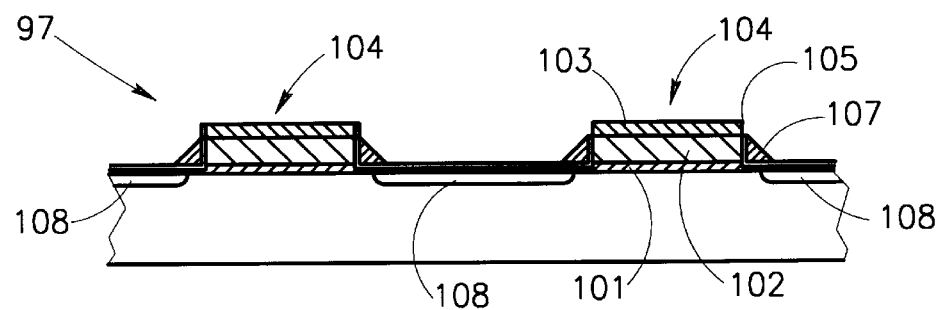
Figure 7F:
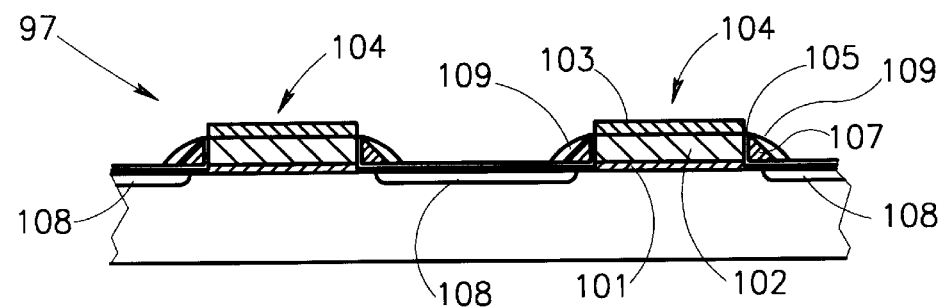
Figure 7G:
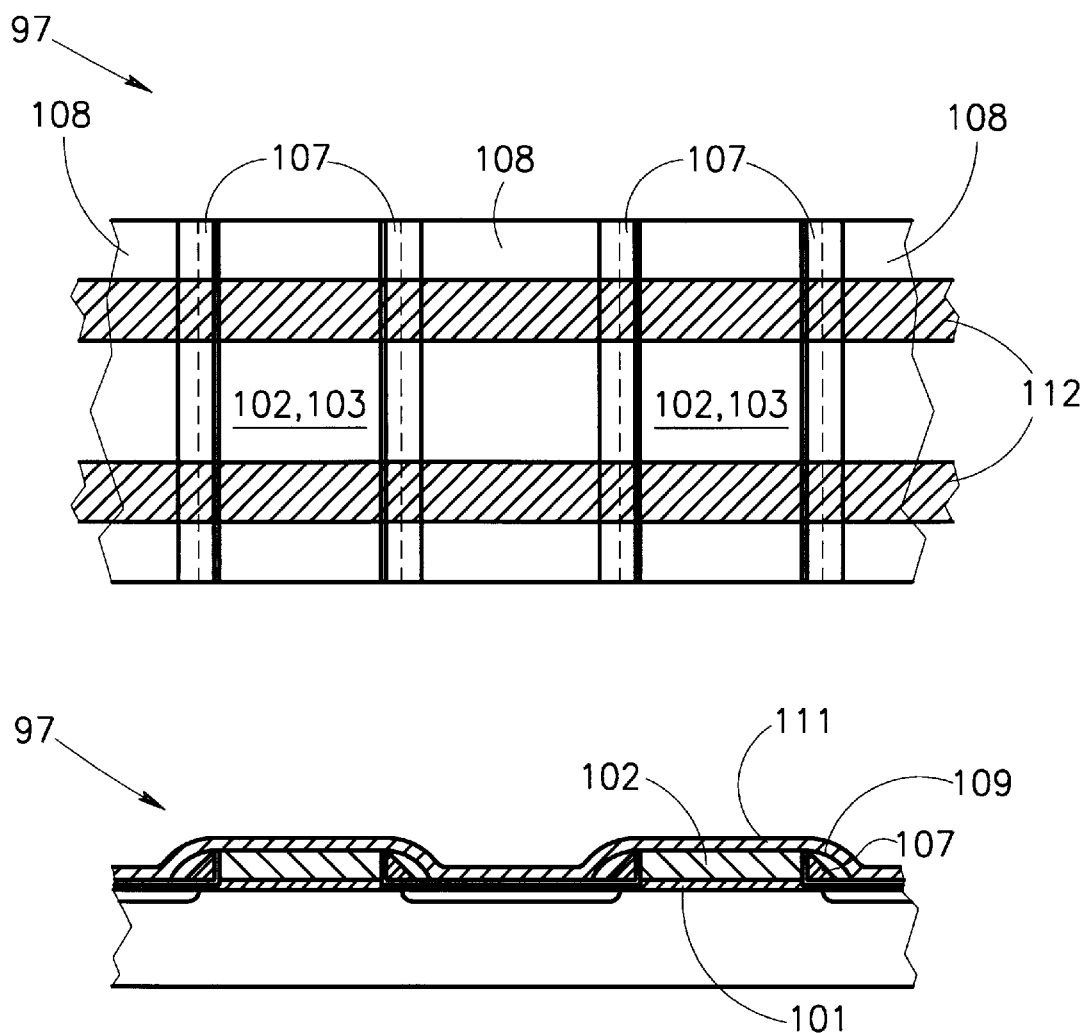

FIGS. 7A, 7C, 7D and 7G each show a top view 97 and a side view 98 of the process. The remaining FIGS. 7B, 7E and 7F show only side views 98.

Initially (FIG. 7A), an oxide layer 101 is grown, typically to 200 Å, on a surface 99 of the entire array after which a control gate, polysilicon layer 102 is deposited, typically 0.2 μm. A nitride layer 103, of typically less than 500 Å, is then deposited over the polysilicon layer 102.

A mask 110 of columns is then laid down over the array and the areas between the columns are etched back. The polysilicon layer 102 and the nitride layer 103 are removed completely and the lower oxide layer 101 is thinned down (see FIG. 7B).

A side wall oxide 105, of 200–500 Å, is grown on the array. The oxide grows on the side walls of the polysilicon 102 and on the portions of surface 99 between elements 102/103. However, oxide 105 does not grow on the sides of nitride 103. Subsequently, a thin, floating gate, polysilicon layer 106, from which the spacer floating gates will be formed, is deposited over the entire array. The thin polysilicon layer is typically of 1000 . 1500 Å. The result is shown in FIG. 7B.

The floating gate polysilicon layer 106 is then anisotropically etched, as in the previous embodiment, to form precursors 107 (FIG. 7C) to the spacer floating gates on the sides of the polysilicon 102. Typically the etch is designed to ensure that the spacers do not extend above the upper surface of polysilicon 102. Top view 97 of FIG. 7C indicates that the precursors 107 extend the entire length of the array.

Following the anisotropic etch is a self-aligned N+ implant (of arsenic or phosphorous) to create the diffusions, labeled 108 (FIG. 7D), between the cells, labeled 104. Subsequently, a layer 109 of oxidation is grown on the entire array (FIG. 7E). It will be appreciated that the N+ implant can occur before or after the oxidation operation. The oxide is typically grown to ensure a thickness of 500 Å on top of the precursor spacers 107. Layer 109 grows over precursors 107 and increases the thickness of layer 105 between the columns of cells 104. However, as shown in FIG. 7E, the oxide layer 109 does not grow over the nitride layers 103.

Accordingly, the nitride layer 103 can be removed, as it is in the next step whose result is shown in FIG. 7F. The removal process involves a chemical wet etch such as is known in the art.

It will be appreciated that, with the removal of the nitride layer 103, the surface of the control gate, polysilicon layer 101 is uncovered. Thus, when the word line, polysilicon layer 111 is deposited, it will connect to the control gate, polysilicon layer 101. However, word line, polysilicon layer 111 will not connect to the floating gate, polysilicon layer 107 due to the insulating oxide layer 109 which covers layer 107.

The polysilicon layer 111 is first deposited on the entire array after which, a word line mask 112 is deposited in rows upon the array. The areas between the rows of word line mask 112 are etched back. This is a self-aligned etch will not only creates the word lines, but it also divides the columns of floating gates 107 into individual elements. Thus, the separate cells of the array are created.

Reference is now briefly made to FIG. 8A which is a layout of the present invention incorporated into a standard EPROM or FLASH EPROM architecture and to FIGS. 8B and 8C which are cross-sections of the portions of the layout of FIG. 8A indicated by lines B—B and C—C, respectively.

In a standard EPROM or FLASH EPROM architecture, the word lines 113 are in columns rather than in rows as in the virtual ground architecture of FIG. 7. Segmented rows of field oxides 114 define rows of cells therebetween. Bit line diffusions 115 are present in the spaces between the field oxide rows 114 and the word line columns 113 and have contacts 116 therein. Source line diffusions 117 are present in the column between the segments of the field oxides.

In the dual bit EPROM of the present invention, floating gates, labeled 118, are found on either side of the word lines 113, in the cell areas between field oxides 114 and, as shown in FIG. 8B, partly on the field oxides 114. As shown in FIGS. 8A and 8C, the word lines 113 are deposited in columns on top of and between the rows of field oxides 114.

Figure 9A:
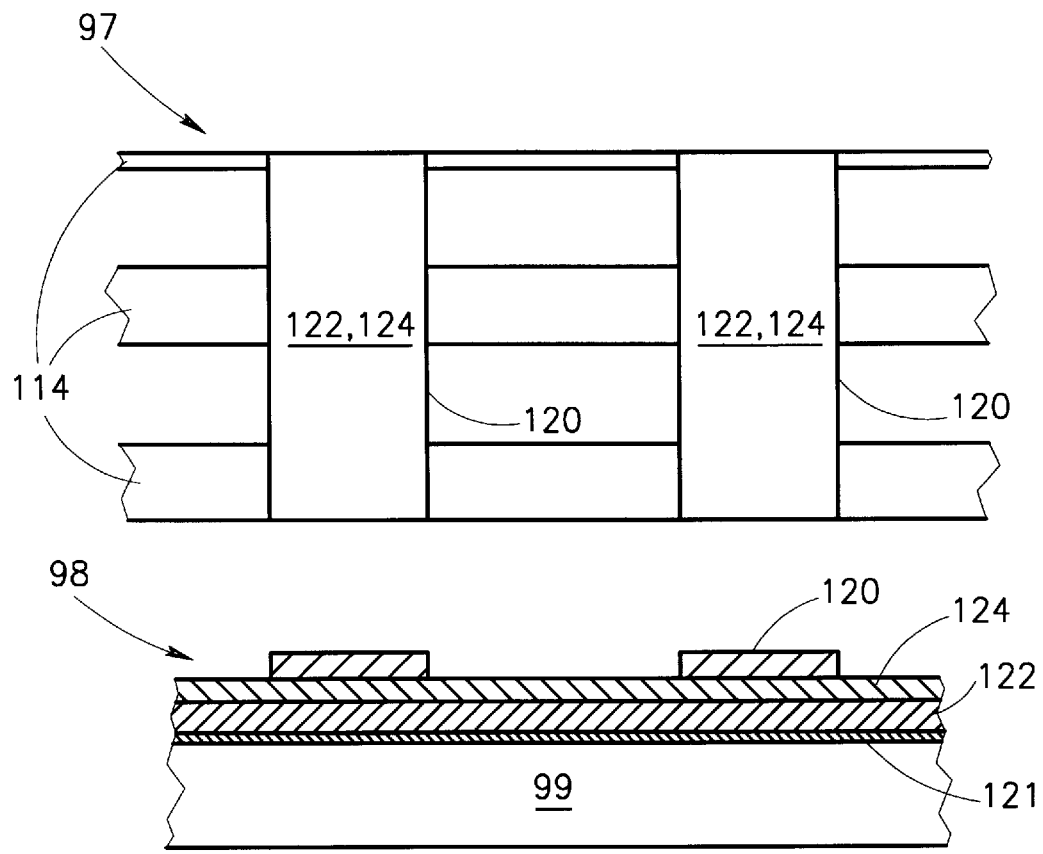
FIGS. 9A, 9B, 9C, 9D and 9E are illustrations of process steps to create the cell of the present invention within the layout of FIG. 8A.
Figure 9B:
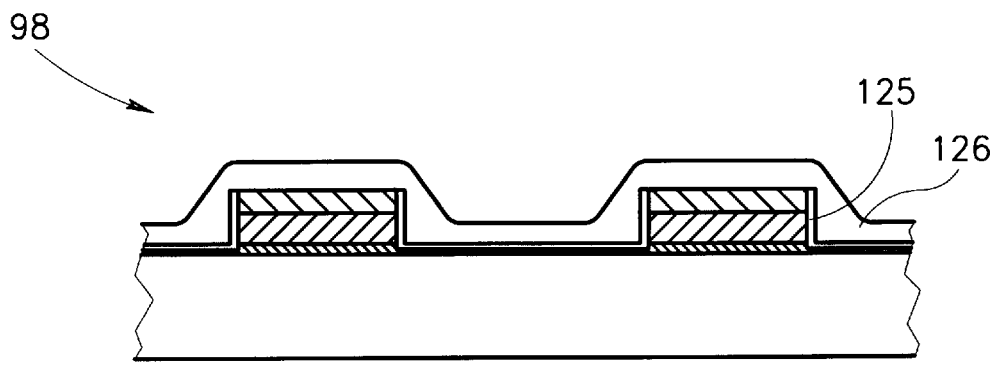
Figure 9C:
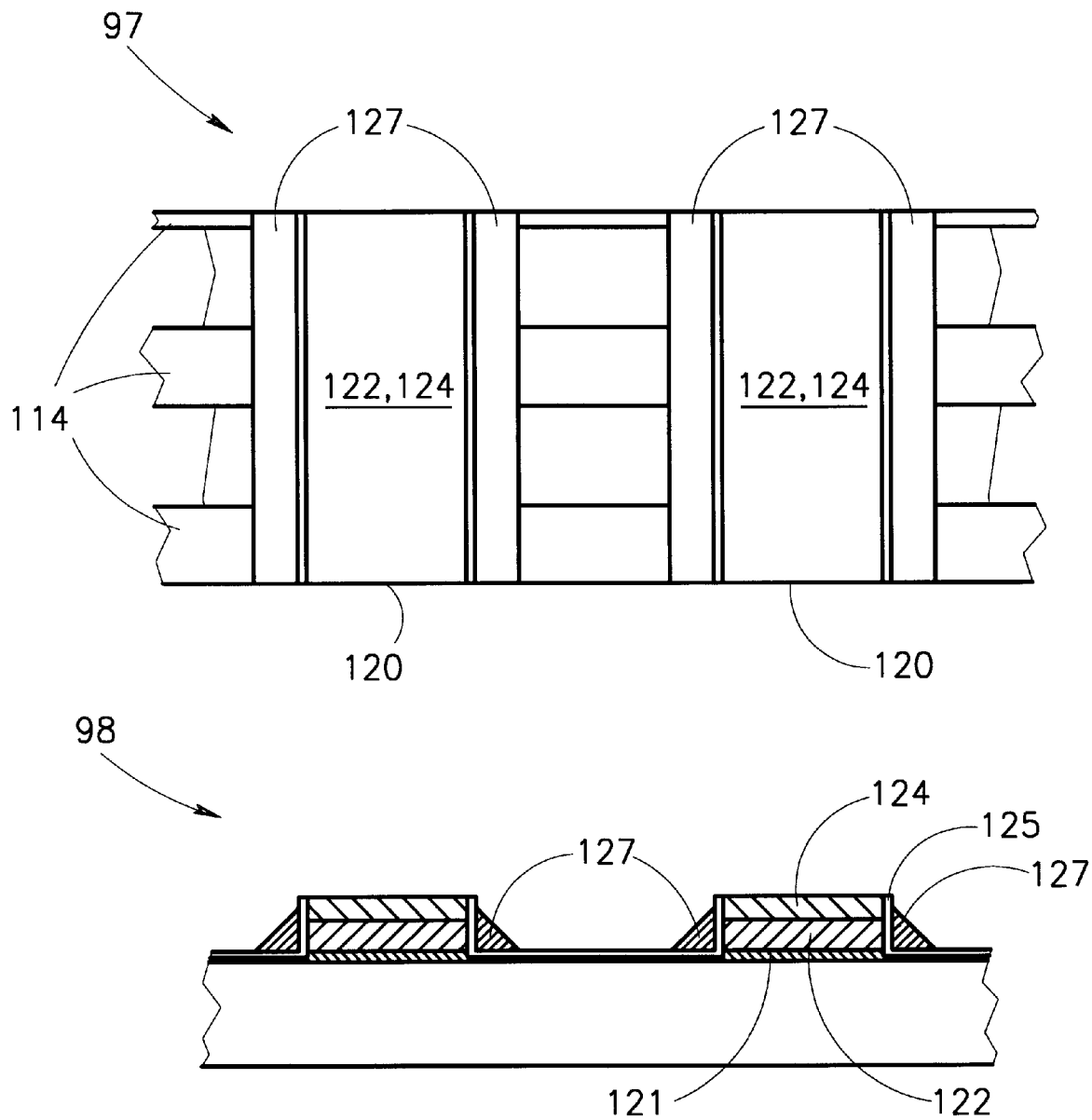

Reference is now made to FIGS. 9A, 9B, 9C, 9D and 9E which illustrate process steps to create the cells of the present invention within the layout of FIG. 8. FIGS. 9A, 9C, 9D and 9E each shown a top view 97 and a side view 98 of the process. FIG. 9B shows only a side view 98.

Initially, the field oxides 114 are grown. An oxide layer 121 is grown, typically to 200 Å, on the entire array after which a control gate, polysilicon layer 122 is deposited over the array, typically to 0.2 μm. An oxide cap 124, typically of 500–1000 Å, is then deposited over the polysilicon layer 102.

A mask 120 of columns is then laid down over the array and the areas between the columns are etched back. The polysilicon layer 122 and the oxide cap 124 are removed completely and the lower oxide layer 121 is thinned down (see FIG. 9B).

The mask 120 is removed and a side wall oxide 125 is grown on the array, growing on the side walls of the polysilicon/oxide cap (PO) elements and on the thinned oxide layer 121 between the PO elements. Subsequently, a thin, floating gate, polysilicon layer 126, from which the spacer floating gates will be formed, is deposited over the entire array. Polysilicon layer 126 is typically of 1000–1500 Å. The result is shown in FIG. 9B.

The floating gate polysilicon layer 126 is then anisotropically etched, as in the previous embodiment, to form precursors 127 (FIG. 9C) to the spacer floating gates on the sides of the PO elements. As in the previous embodiment and as shown in top view 97 of FIG. 9C, the precursors 127 extend the entire length of the array.

Figure 9D:
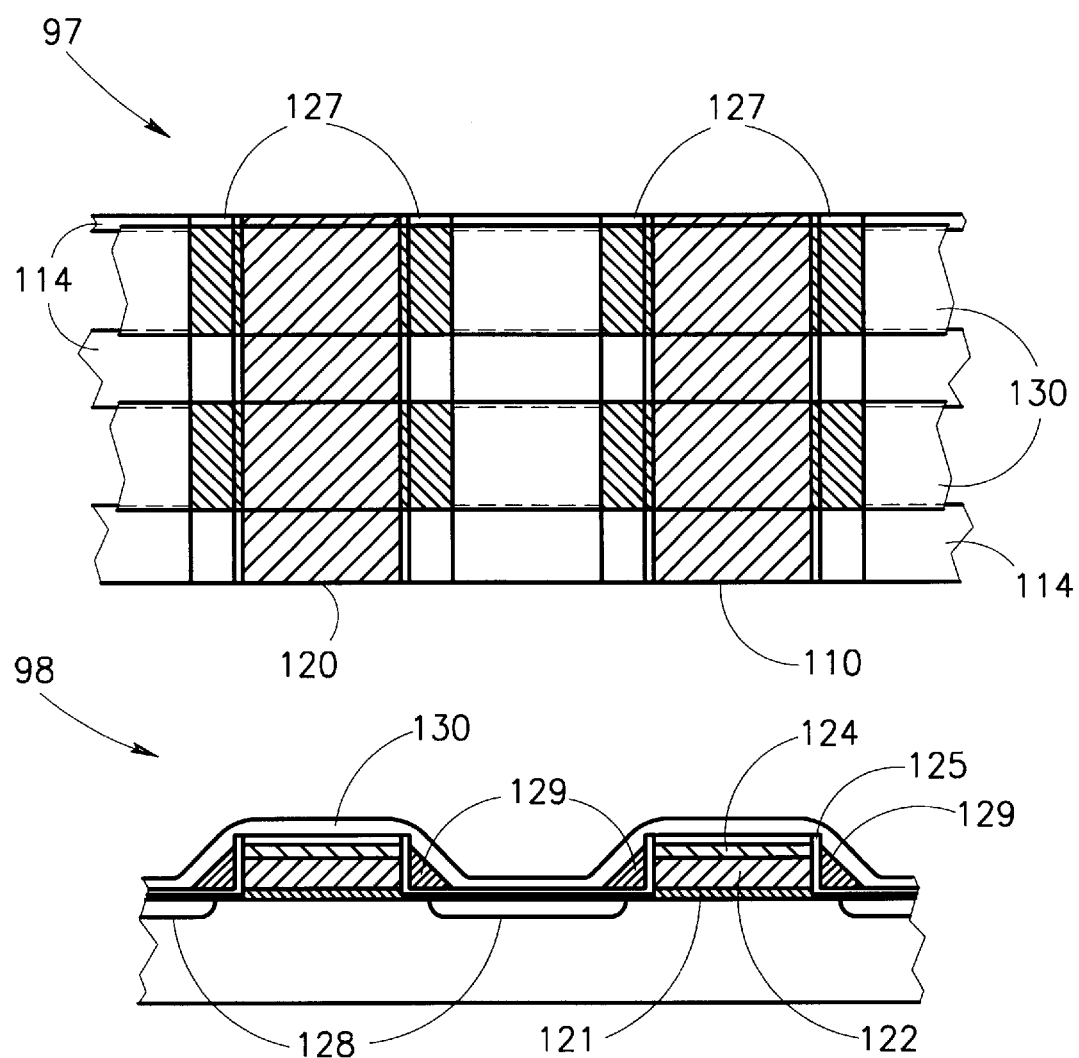
Figure 9E:
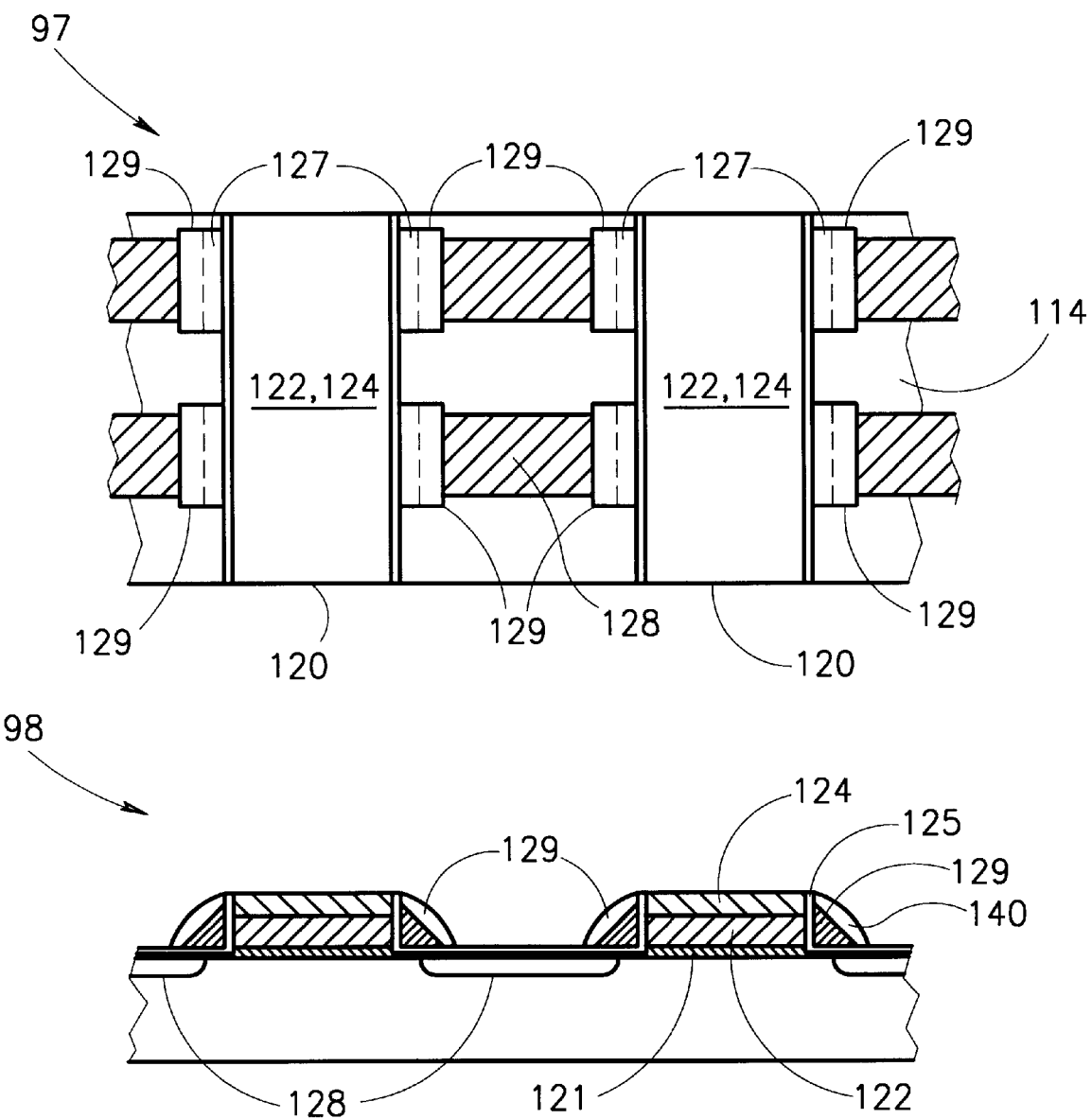

Subsequently, a floating gate mask, shown in the top view 97 of FIG. 9D, of rows 130 is laid down on the array and a polysilicon etch is performed, thereby cutting the precursors 127 into individual floating gates 129. The etch does not cut polysilicon layer 122 since it is capped by the thick oxide caps 124. The cut floating gates 129 are shown in top view 97 of FIG. 9E.

An oxide layer 140 is then grown over the entire array to ensure a thickness of 500 Å over the floating gates 129. As shown in side view 98 of FIG. 9E, this oxide layer coats the floating gates 129 and adds to the oxide cap 124 and to the oxide layer 121.

Following the oxidation is a self-aligned N+ implant (of arsenic or phosphorous) to create the diffusions, labeled 128 (FIG. 9E), between the floating gates 129 and the field oxides 114. The diffusions 128 can form either the bit lines 115 or the source line 117, depending on their location on the array.

It will be appreciated by persons skilled in the art that the present invention is not limited to what has been particularly shown and described hereinabove. Rather the scope of the present invention is defined only by the claims which follow:

I claim:

1. A dual bit memory cell comprising:

a substrate;

a gate unit; and left and right diffusions implanted into said substrate on left and right sides of said gate unit such that a channel exists under said gate unit and between said left and right diffusions, wherein said gate unit comprises:

a control gate located above said substrate and having left and right sides; and left and right separately programmable and separately readable floating gates located on said left and right sides, respectively, of said control gate and each controlling a short portion of said channel, wherein said left diffusion acts as a drain and said right diffusion acts as a source when reading the value stored in said right floating gate and said right diffusion, acts as a drain and said left diffusion acts as a source when reading the value stored in said left floating gate.

2. A memory cell according to claim 1 and wherein said floating gates are formed of polysilicon spacers.

3. A memory cell according to claim 1 and wherein said short portion is less than 0.2 μm in length.

4. A memory cell according to claim 1 and wherein said left diffusion acts as a drain and said right diffusion acts as a source when programming the value stored in said left floating gate and said right diffusion acts as a drain and said left diffusion acts as a source when programming the value stored in said right floating gate.

5. A memory cell according to claim 1 wherein each floating gate is programmed in the opposite direction to the direction of reading.

6. A memory cell according to claim 1 which is an electrically programmable read only memory cell.

7. A memory cell according to claim 1 which is a FLASH electrically erasable programmable read only memory cell.

* * * * *